US010216103B2

(12) United States Patent
Nakagawa

(10) Patent No.: US 10,216,103 B2
(45) Date of Patent: Feb. 26, 2019

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Kazuki Nakagawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 290 days.

(21) Appl. No.: 14/848,436

(22) Filed: Sep. 9, 2015

(65) Prior Publication Data
US 2016/0077451 A1 Mar. 17, 2016

(30) Foreign Application Priority Data
Sep. 17, 2014 (JP) .................................. 2014-189443

(51) Int. Cl.
G03F 9/00 (2006.01)
G03F 7/00 (2006.01)
(52) U.S. Cl.
CPC .......... *G03F 9/7042* (2013.01); *G03F 7/0002* (2013.01)
(58) Field of Classification Search
CPC .................................................. G03F 9/7042
See application file for complete search history.

(56) References Cited

U.S. PATENT DOCUMENTS

| 2011/0141489 A1* | 6/2011 | Sato ....................... G01B 11/02 356/618 |
| 2013/0093113 A1 | 4/2013 | Hayashi et al. |
| 2014/0138875 A1 | 5/2014 | Torii et al. |
| 2016/0223919 A1* | 8/2016 | Nakagawa ............ G03F 9/7042 |

FOREIGN PATENT DOCUMENTS

| JP | 2013038365 A | 2/2013 |
| JP | 2013102132 A | 5/2013 |
| JP | 2013125817 A | 6/2013 |

(Continued)

OTHER PUBLICATIONS

English translation of Office Action issued in Korean Appln. No. 10-2015-0127550 dated Apr. 2, 2018, previously cited in IDS filed Apr. 13, 2018.

(Continued)

*Primary Examiner* — Ryan M Ochylski
(74) *Attorney, Agent, or Firm* — Rossi, Kimms & McDowell LLP

(57) ABSTRACT

The present invention provides an imprint method of molding an imprint material supplied on a shot region of a substrate by a mold having a pattern region in which a pattern has been formed, the method comprising a deformation step of performing, based on information indicating at least one among a shape of the pattern region and a shape of the shot region, deformation of at least one region among the pattern region and the shot region, an estimation step of estimating a moving amount of a mark by the deformation, the mark being provided in the at least one region, and an overlay step of performing, based on the moving amount and detection results of positions of a mark in the pattern region and a mark in the shot region, overlay between the pattern region and the shot region.

15 Claims, 3 Drawing Sheets

(56) References Cited

FOREIGN PATENT DOCUMENTS

| JP | 2014053495 A | 3/2014 |
| KR | 1020110035903 A | 4/2011 |
| KR | 1020110132238 A | 12/2011 |
| KR | 1020130061065 A | 6/2013 |

OTHER PUBLICATIONS

English translation of Office Action issued in Japanese Appln. No. 2014-189443 dated Aug. 3, 2018, previously cited in IDS filed Aug. 21, 2018.

\* cited by examiner

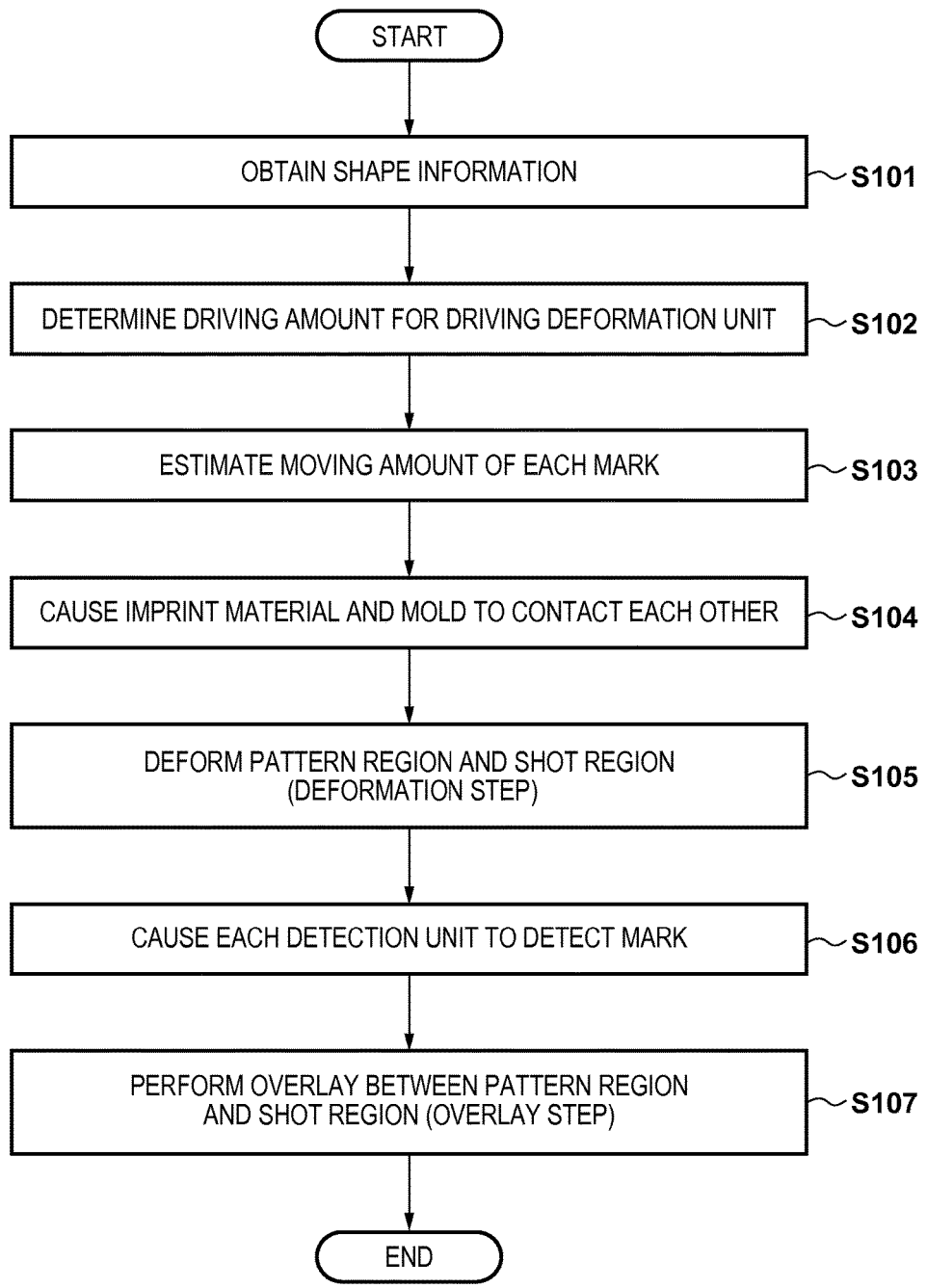

FIG. 3A
FIG. 3B
FIG. 4A
FIG. 4B
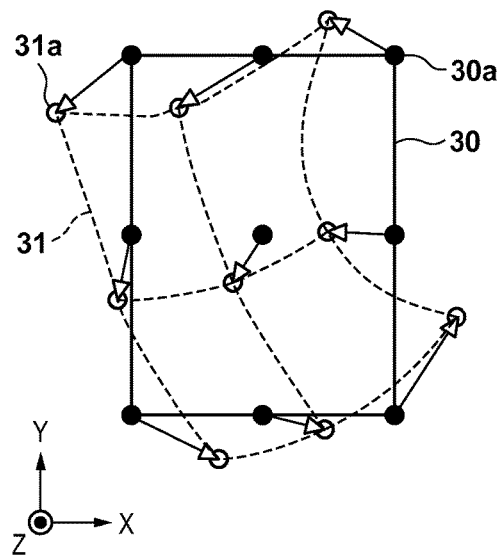
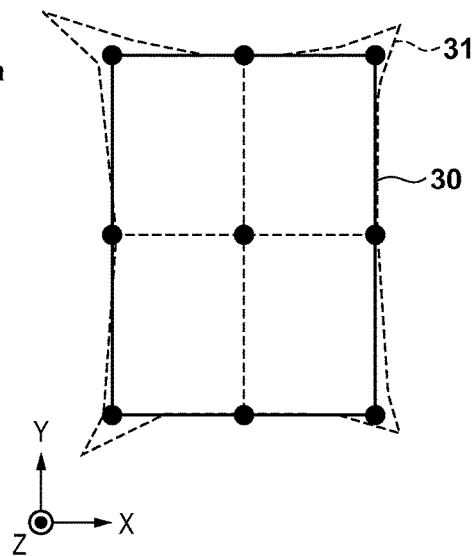
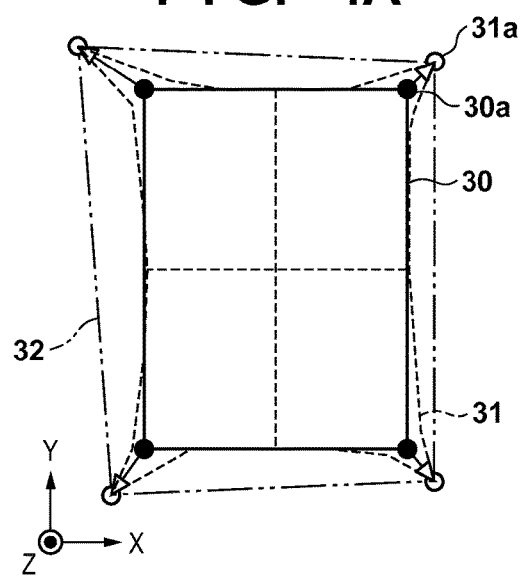
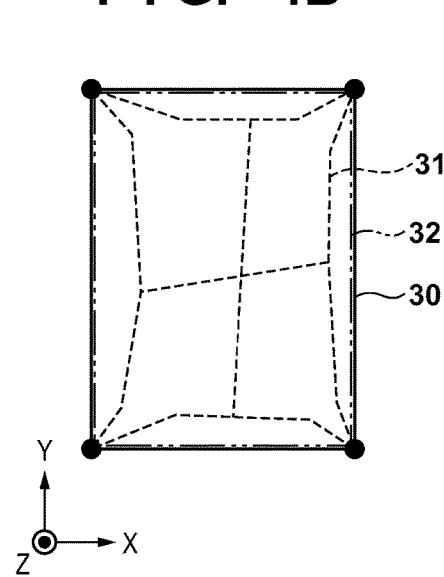

IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

An imprint apparatus that molds an imprint material supplied onto a substrate by using a mold has received attention as one of lithography apparatuses for mass-producing semiconductor devices, magnetic storage media, and the like. The imprint apparatus is required to accurately overlay a pattern region on the mold and a shot region on the substrate. Japanese Patent Laid-Open No. 2013-102132 has proposed a method of accurately overlaying a pattern region and a shot region by applying a force to a mold to deform the pattern region in combination with heating a substrate to deform the shot region.

In the imprint apparatus, for example, the pattern region and the shot region are deformed based on information indicating their shapes, and then overlay between the pattern region and the shot region is performed based on the detection results of the positions of a mark in the pattern region and a mark in the shot region. In such an imprint apparatus, when the pattern region and the shot region are deformed, the moving amount of the position of the mark in the pattern region and the moving amount of the position of the mark in the shot region by the deformation may be different. In this case, it can be difficult to accurately overlay the pattern region and the shot region if overlay is performed so as to match the mark in the pattern region and the mark in the shot region without considering their moving amounts.

SUMMARY OF THE INVENTION

The present invention provides a technique advantageous in, for example, accurately overlaying a pattern region on a mold and a shot region on a substrate.

According to one aspect of the present invention, there is provided an imprint method of molding an imprint material supplied on a shot region of a substrate by a mold having a pattern region in which a pattern has been formed, the method comprising: a deformation step of performing, based on information indicating at least one among a shape of the pattern region and a shape of the shot region, deformation of at least one region among the pattern region and the shot region such that the shape of the pattern region and the shape of the shot region get close to each other; an estimation step of estimating a moving amount of a mark by the deformation, the mark being provided in the at least one region where has been deformed in the deformation step; and an overlay step of performing, based on the moving amount and detection results of positions of a mark in the pattern region and a mark in the shot region, overlay between the pattern region and the shot region in a state in which the at least one region has been deformed in the deformation step.

Further features of the present invention will become apparent from the following description of exemplary embodiments with reference to the attached drawings.

BRIEF DESCRIPTION OF THE DRAWINGS

FIG. 2 is a flowchart showing the flow of alignment in the imprint apparatus according to the first embodiment;

FIG. 3A is a view showing the shape of a pattern region and the shape of a shot region;

FIG. 3B is a view showing the shape of the pattern region and the shape of the shot region when the shape of the pattern region and the shape of the shot region are brought close to each other;

FIG. 4A is a view showing a state in which a position deviation is caused between marks at the four corners of the pattern region and marks at the four corners of the shot region; and FIG. 4B is a view for explaining overlay between the pattern region and the shot region.

DESCRIPTION OF THE EMBODIMENTS

Figure 1:
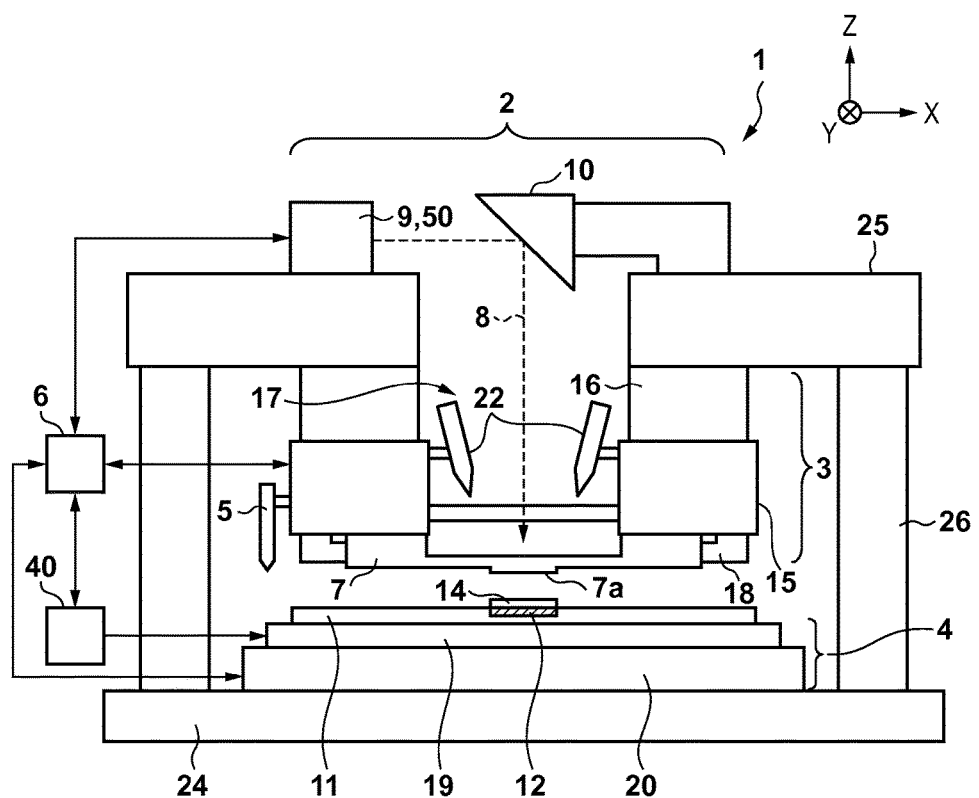
FIG. 1 is a view showing an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 1 according to the first embodiment of the present invention will be described with reference to FIG. 1. The imprint apparatus 1 is used to manufacture a semiconductor device or the like. The imprint apparatus 1 performs an imprint process of molding an imprint material 14 on a substrate by using a mold 7 with a pattern region in which a pattern has been formed. For example, the imprint apparatus 1 cures the imprint material 14 in a state in which the mold 7 and the imprint material 14 (resin) on the substrate contact each other. Then, the imprint apparatus 1 widens the interval between the mold 7 and a substrate 11, separates (releases) the mold 7 from the cured imprint material 14, and thus can form a pattern made of the imprint material 14 on the substrate. Methods of curing an imprint material include a heat cycle method using heat and a photo-curing method using light. In the first embodiment, an example in which the photo-curing method is adopted will be described. The photo-curing method is a method of supplying an uncured ultraviolet-curing resin as the imprint material onto a substrate, and irradiating the imprint material with ultraviolet rays in the state in which the mold and the resin contact each other, thereby curing the imprint material.

[Apparatus Configuration]

FIG. 1 is a view showing the imprint apparatus 1 according to the first embodiment. The imprint apparatus 1 can include, for example, a mold holding unit 3 that holds the mold 7, a substrate stage 4 that holds the substrate 11, an irradiation unit 2, detection units 22, and a supply unit 5. The mold holding unit 3 is fixed to a bridge plate 25 supported by a base plate 24 via a column 26. The substrate stage 4 is configured to be movable on the base plate 24. The imprint apparatus 1 includes a control unit 6 that includes a CPU and a memory, and controls the imprint process (controls each unit of the imprint apparatus 1). The imprint process is performed by executing a program stored in the memory of the control unit 6.

The mold 7 is generally made of a material capable of transmitting ultraviolet rays, such as quartz. A three-dimensional pattern for molding the imprint material 14 on the substrate 11 is formed in a partial region (pattern region 7a) on the substrate-side surface. The substrate 11 is, for example, a single-crystal silicon substrate or an SOI (Silicon On Insulator) substrate. The supply unit 5 supplies the imprint material 14 (ultraviolet-curing resin) onto the upper surface (surface to be processed) of the substrate 11.

The mold holding unit 3 includes a mold chuck 15 that holds the mold 7 by a vacuum chuck force, an electrostatic force, or the like, and a mold driving unit 16 that drives the mold chuck 15 in the Z direction. The mold chuck 15 and the mold driving unit 16 have an aperture region 17 at their center portions (insides), and are configured so that light emitted by the curing unit 2 passes through the mold 7 to irradiate the substrate 11. The pattern region 7a on the mold has, for example, a rectangular shape. However, the pattern region 7a sometimes includes a deformation component such as a magnification component or a trapezoidal component owing to a manufacturing error, a thermal deformation, or the like. To cancel this, the mold holding unit 3 includes a pressure unit 18 that deforms the pattern region 7a by adding a force to a plurality of portions on the side surface of the mold 7. The deformation component in the pattern region 7a can be corrected and the pattern region 7a of the mold 7 can be deformed into a desired shape by adding the force to the plurality of portions on the side surfaces of the mold 7 by the pressure unit 18, as described above. The pressure unit 18 can include a plurality of actuators such as piezoelectric actuators.

The mold driving unit 16 includes an actuator such as a linear motor or an air cylinder, and drives the mold chuck 15 (mold 7) in the Z direction so as to bring the mold 7 into contact with the imprint material 14 on the substrate or separate it from the imprint material 14 on the substrate. Since high-accuracy alignment is requested of the mold driving unit 16 when bringing the mold 7 and the imprint material 14 on the substrate into contact with each other, the mold driving unit 16 may be constituted by a plurality of driving systems such as a coarse driving system and a fine driving system. The mold driving unit 16 may have, for example, a position adjustment function of not only driving the mold 7 in the Z direction but also adjusting the position of the mold 7 in the X and Y directions and the θ direction (rotational direction around the Z-axis), and a tilt function of correcting the tilt of the mold 7. In the imprint apparatus 1 according to the first embodiment, the mold driving unit 16 performs an operation of changing the distance between the substrate 11 and the mold 7. However, a stage driving unit 20 of the substrate stage 4 may perform this operation, or both the stage driving unit 20 and the mold driving unit 16 may perform this operation.

The substrate stage 4 includes a substrate holding unit 19 and the stage driving unit 20, and drives the substrate 11 in the X and Y directions. The substrate holding unit 19 holds the substrate 11 by a holding force such as a vacuum chuck force or an electrostatic force. The stage driving unit 20 mechanically holds the substrate holding unit 19, and drives the substrate holding unit 19 (substrate 11) in the X and Y directions. The stage driving unit 20 may use, for example, a linear motor and may be constituted by a plurality of driving systems such as a coarse driving system and a fine driving system. The stage driving unit 20 may have, for example, a driving function of driving the substrate 11 in the Z direction, a position adjustment function of rotating and driving the substrate 11 in the θ direction to adjust the position of the substrate 11, and a tilt function of correcting the tilt of the substrate 11.

A position measurement unit 40 measures the position of the substrate stage 4. The position measurement unit 40 includes, for example, a laser interferometer or an encoder and measures the position of the substrate stage 4. An example in which the position measurement unit 40 includes the laser interferometer will be described here. The laser interferometer irradiates a reflecting plate provided on the side surface of the substrate stage 4 (for example, the substrate holding unit 19) with a laser beam, and detects a displacement from a reference position on the substrate stage 4 based on the laser beam reflected by the reflecting plate. Based on the displacement detected by the laser interferometer, the position measurement unit 40 can measure the current position of the substrate stage 4.

Each detection unit 22 detects the positions of marks (alignment marks) provided in the pattern region 7a and marks (alignment marks) provided in a shot region 12. In order to accurately overlay the pattern region 7a and the shot region 12, it is desirable to detect as many marks as possible provided in the pattern region 7a and the shot region 12, respectively. Therefore, in order to detect many marks at the same time without decreasing throughput in the imprint apparatus 1, many detection units 22 that detect the marks provided in the pattern region 7a and the shot region 12 need to be provided. However, if the imprint apparatus 1 includes many detection units 22, an apparatus configuration can be complicated and an apparatus cost can also be increased. Therefore, the imprint apparatus 1 includes the number (second number) of detection units 22 that can only detect some marks out of the plurality of marks provided in the pattern region 7a and the shot region 12, respectively, at the same time. In the first embodiment, for example, the imprint apparatus 1 includes the four detection units 22 such that the marks respectively provided at the four corners of the pattern region 7a and the four corners of the shot region 12 can be detected at the same time.

The shot region 12 on the substrate has, for example, a rectangular shape. However, the shot region 12 sometimes includes a deformation component such as a magnification component or a trapezoidal component owing to an influence of, for example, a series of semiconductor device manufacturing steps. In this case, in order to accurately overlay the pattern region 7a on the mold and the shot region 12 on the substrate, the pressure unit 18 may deform the shot region 12 as well as the pattern region 7a. Therefore, as will be described later, the imprint apparatus 1 according to the first embodiment can include a heating unit 50 that deforms the shot region 12 by heating the substrate 11. That is, in the first embodiment, at least one of the pressure unit 18 and the heating unit 50 can be used as a deformation unit that deforms at least one of the pattern region 7a and the shot region 12.

The irradiation unit 2 can include a curing unit 9 that cures the imprint material 14 on the substrate by irradiating the imprint material 14 with light, and the heating unit 50 that deforms the shot region 12 by irradiating the substrate 11 with light. The irradiation unit 2 can also include an optical member 10 that guides, onto the substrate, light emitted by the curing unit 9 and light emitted by the heating unit 50. In the imprint apparatus 1 according to the first embodiment, as shown in FIG. 1, the curing unit 9 and the heating unit 50 are formed as one unit. However, the present invention is not limited to this, and they may be formed as separate units. The curing unit 9 can include a light source that emits light (ultraviolet rays) for curing the imprint material 14 on the substrate, and an optical system that shapes light emitted by the light source into light suitable for the imprint process. The heating unit 50 can include a light source that emits light having a certain wavelength suitable for heating the substrate 11 without curing the imprint material 14 supplied onto the substrate, and a light adjustment unit configured to adjust the intensity of light emitted by the light source. The light adjustment unit of the heating unit 50 adjusts the intensity of light irradiating the substrate 11 so that the temperature distribution in the shot region 12 becomes a desired one. As the light adjustment unit of the heating unit 50, for example, a liquid crystal device or a digital mirror device (DMD) is available.

[Imprint Process]

The imprint process in the imprint apparatus 1 according to the first embodiment will now be described. The control unit 6 controls the substrate stage 4 so that the shot region 12 on the substrate where the pattern of the mold 7 should be transferred is arranged below the supply unit 5. When the shot region 12 is arranged below the supply unit 5, the control unit 6 controls the supply unit 5 to supply the imprint material 14 to the shot region 12. After the imprint material 14 is supplied to the shot region 12, the control unit 6 controls the substrate stage 4 so that the shot region 12 is arranged below the pattern region 7a on the mold. When the shot region 12 is arranged below the pattern region 7a on the mold, the control unit 6 controls the mold driving unit 16 to drive the mold 7 in the −Z direction, and brings the mold 7 and the imprint material 14 on the substrate into contact with each other (pressing step). Then, the control unit 6 waits for an elapse of a predetermined time in the state in which the mold 7 and the imprint material 14 on the substrate contact each other. The imprint material 14 on the substrate can thus completely fill the pattern of the mold 7.

The control unit 6 performs alignment between the shot region 12 and the pattern region 7a of the mold 7 in the X and Y directions in the state in which the mold 7 and the imprint material 14 on the substrate contact each other. Alignment can include a "deformation step" of deforming the pattern region and the shot region such that the shape of the pattern region 7a and the shape of the shot region 12 get close to each other, and an "overlay step" of overlaying the pattern region 7a and the shot region 12. Alignment between the pattern region 7a and the shot region 12 will be described in detail later. After performing alignment between the pattern region 7a and the shot region 12, the control unit 6 controls the curing unit 9 to irradiate the imprint material 14 on the substrate with light (ultraviolet rays) via the mold 7. Then, the control unit 6 controls the mold driving unit 16 to drive the mold 7 in the +Z direction and separates the mold 7 from the imprint material 14 on the substrate that has been cured by irradiation with light (separation step). This makes it possible to mold the imprint material 14 on the substrate by using the mold 7 and form the pattern made of the imprint material 14 on the substrate. Such an imprint process is performed for each of the plurality of shot regions 12 on the substrate.

[Alignment]

Alignment in the imprint apparatus 1 according to the first embodiment will now be described. In the imprint apparatus 1, for example, at least one region among the pattern region 7a and the shot region 12 is deformed based on information, obtained in advance, indicating at least one of the shape of the pattern region 7a and the shape of the shot region 12. When at least one region among the pattern region 7a and the shot region 12 is deformed based on the information as described above, a relative position deviation may occur between the pattern region 7a and the shot region 12. To cope with this, in alignment in the imprint apparatus 1 according to the first embodiment, the "overlay step" is performed, in addition to the "deformation step" of deforming at least one region among the pattern region 7a and the shot region 12 based on the information. In the overlay step, the shapes and the relative positions of the pattern region 7a and the shot region 12 are corrected based on a result of a detection by each detection unit 22 in a state in which at least one region among the pattern region 7a and the shot region 12 has been deformed in the deformation step.

The deformation step is a step of deforming at least one region among the pattern region 7a and the shot region 12 so as to correct a high-order component such as an arcuate component or a barrel component included in the pattern region 7a or the shot region 12. Therefore, the deformation step may be performed based on the information obtained by detecting as many marks as possible out of the plurality of marks provided in the pattern region 7a and the shot region 12, respectively. In the first embodiment, the information is obtained by detecting the first number (for example, nine) of marks out of the plurality of marks provided in the pattern region 7a and the shot region 12, respectively.

On the other hand, the overlay step is a step of overlaying, based on the result of the detection by each detection unit 22, the pattern region 7a and the shot region 12 so as to correct a low-order component such as shift correction or magnification correction between them. The overlay step can be performed in a state in which the pattern region 7a and the shot region 12 have been deformed in the deformation step. That is, the overlay step only corrects the low-order component, and thus can be performed by using the marks smaller in number than the marks detected to obtain the information used in the deformation step. In the first embodiment, the four detection units 22 detect, in the overlay step, the marks having the second number (four) smaller than the first number arranged at the four corners of the pattern region having the rectangular shape and at the four corners of the shot region having the rectangular shape. As described above, only the low-order component is corrected in the overlay step. It is therefore possible to reduce the number of detection units 22, and suppress complication of the apparatus configuration and a decrease in throughput.

Alignment in the imprint apparatus 1 according to the first embodiment will be described below with reference to FIG. 2. FIG. 2 is a flowchart showing the flow of alignment in the imprint apparatus 1 according to the first embodiment.

In step S101, the control unit 6 obtains the information (to be referred to as shape information hereinafter) indicating at least one among the shape of the pattern region 7a on the mold and the shape of the shot region 12 on the substrate. As described above, the first number (nine) of marks out of the plurality of marks provided in the pattern region 7a and the shot region 12 need to be detected in order to obtain the shape information. In the imprint apparatus 1 according to the first embodiment, however, the number of detection units 22 is set to four (second number) smaller than the first number in order to suppress complication of the apparatus configuration and the decrease in throughput. Therefore, before starting the imprint process, the first number of marks may be detected in an external measurement apparatus of the imprint apparatus 1, and at least one among the shape of the pattern region 7a and the shape of the shot region 12 may be obtained as the shape information. This allows the control unit 6 to obtain the shape information from the external measurement apparatus, and obtain the shape difference between the pattern region 7a and the shot region 12 so as to include the high-order component.

FIG. 3A is a view showing the shape of the pattern region 7a and the shape of the shot region 12. In FIG. 3A, a solid line 30 indicates the shape of the shot region 12 and a broken line 31 indicates the shape of the pattern region 7a. Their shapes are respectively obtained from nine marks 30a provided in the shot region 12 and nine marks 31a provided in the pattern region 7a. In FIG. 3A, the shape of the shot region 12 indicated by the solid line 30 is set to an ideal shape (rectangular shape) for the sake of simplicity. In practice, however, a deformation including the high-order component or the low-order component is sometimes generated in the shot region 12 as well. That is, in FIG. 3A, it can also be considered that, for example, the solid line 30 indicates the target shape difference between the pattern region 7a and the shot region 12, and the broken line 31 indicates the actual shape difference between the pattern region 7a and the shot region 12.

In the first embodiment, the shape of the pattern region 7a and the shape of the shot region 12 as the shape information are obtained by the external measurement apparatus of the imprint apparatus. However, the present invention is not limited to this. The shape of the pattern region 7a and the shape of the shot region 12 as the shape information may be obtained by repeating, for example, detection of mark positions by the four detection units 22 and the movement of the substrate stage 4 within the imprint apparatus 1 to detect the positions of the first number of marks.

In step S102, the control unit 6 determines, based on the shape information obtained in step S101, a driving amount for driving the deformation unit (the pressure unit and the heating unit) such that the shape of the pattern region 7a and the shape of the shot region 12 get close to each other. That is, the control unit 6 determines the driving amount of the deformation unit such that the shape difference between the pattern region 7a and the shot region 12 approaches the target shape difference. The determined driving amount will be used in a later deformation step (step S105). In the deformation step, in order to correct the high-order component, it is desirable to use, in combination, the heating unit 50 that deforms the shot region 12 by heating the substrate 11 and the pressure unit 18 that deforms the pattern region 7a by adding a force to the mold 7. In this case, the control unit 6 can determine the driving amount for driving the pressure unit 18 and the driving amount for driving the heating unit 50 such that the shape difference between the pattern region 7a and the shot region 12 approaches the target shape difference. If one of the pattern region 7a and the shot region 12 is deformed, the control unit 6 can determine the driving amount for driving the pressure unit 18 or the driving amount for driving the heating unit 50.

In step S103, the control unit 6 estimates, by deforming at least one of the pattern region 7a and the shot region 12 in accordance with the driving amount determined in step S102, an amount of movement of each mark (the moving amount of each mark) in the region where the deformation has been performed. The moving amount may be estimated for each of the plurality of marks to be detected in a later overlay step (step S107). FIG. 3B is a view showing the shape of the pattern region 7a and the shape of the shot region 12 when driving the pressure unit 18 and the heating unit 50 in accordance with the driving amount determined in step S102 to bring the shape of the pattern region 7a and the shape of the shot region 12 close to each other. If the pressure unit 18 adds a force to the mold 7, unintended deformation owing to a Poisson's ratio can be generated in the pattern region 7a. On the other hand, if the heating unit 50 heats the substrate 11, isotropic deformation may be generated in the shot region 12. Therefore, the combined use of the pressure unit 18 and the heating unit 50 makes it possible to reduce deformation of the pattern region 7a owing to the Poisson's ratio by isotropic deformation of the shot region 12, making it easier to bring the shape of the pattern region 7a and the shape of the shot region 12 close to each other. If the pressure unit 18 and the heating unit 50 are used in combination as described above, the position deviation of the marks may occur between, for example, the four corners of the pattern region 7a and the four corners of the shot region 12, as shown in FIG. 3B, when bringing the shape of the pattern region 7a and the shape of the shot region 12 close to each other.

In this case, if the marks of the pattern region 7a and the marks of the shot region 12 are matched in the X and Y directions without considering the position deviation of the marks in the later overlay step, it can be difficult to accurately overlay the pattern region 7a and the shot region 12. Therefore, in the overlay step, the position deviation of the marks may be considered when overlaying the pattern region 7a and the shot region 12. That is, in the overlay step, the moving amounts of the marks at the four corners of the pattern region 7a and the moving amounts of the marks at the four corners of the shot region 12 may be considered when the pattern region 7a and the shot region 12 have been deformed in accordance with the driving amount determined in step S102. In the imprint apparatus 1 according to the first embodiment, therefore, the control unit 6 obtains, based on the driving amount determined in step S102, the moving amounts of the marks at the four corners of the pattern region 7a and the moving amounts of the marks at the four corners of the shot region 12. The obtained moving amounts can be used in the later overlay step (S107).

These moving amounts can be calculated based on, for example, information (to be referred to as deformation amount information hereinafter) indicating the relationship between the driving amount of the pressure unit 18 and the deformation amount of the pattern region 7a, and the relationship between the driving amount of the heating unit 50 and the deformation amount of the shot region 12. The deformation amount information is represented by, for example, a database or a function. The relationship between the driving amount of the pressure unit 18 and the deformation amount of the pattern region 7a can be obtained by, for example, performing the deformation analysis of the mold 7 when driving the pressure unit 18 in a simulation, an experiment using a dummy substrate, or the like. Similarly, the relationship between the driving amount of the heating unit 50 and the deformation amount of the shot region 12 can be obtained by, for example, performing the thermal deformation analysis of the substrate 11 when driving the heating unit 50 in the simulation, the experiment using the dummy substrate, or the like. Note that the dummy substrate may be a substrate where no imprint process is performed or a substrate where the imprint process is first performed (for example, the first substrate in a lot) out of a plurality of substrates where the imprint processes should be performed.

In step S104, the control unit 6 controls the mold holding unit 3 to bring the mold 7 and the imprint material 14 supplied onto the shot region into contact with each other. In step S105, the control unit 6 controls the pressure unit 18 and the heating unit 50 in accordance with the driving amount determined in step S102 to deform the pattern region 7a and the shot region 12 such that the shape of the pattern region 7a and the shape of the shot region 12 get close to each other (deformation step). When the heating unit 50 deforms the shot region 12, it takes a considerable time for the substrate 11 to have a desired temperature distribution. Therefore, the shot region 12 may be deformed by the heating unit 50 during a period when the imprint material 14 and the mold 7 are brought into contact with each other, and the three-dimensional pattern formed on the mold 7 is filled with the imprint material 14. Further, in step S105, both the pressure unit 18 and the heating unit 50 are controlled so as to correct the high-order component, and both the pattern region 7a and the shot region 12 are deformed. However, the present invention is not limited to this. For example, at least one of the pressure unit 18 and the heating unit 50 may be controlled to deform at least one of the pattern region 7a and the shot region 12. The deformation step in step S105 may be performed before bringing the imprint material and the mold into contact with each other (step S104) or may be performed in parallel.

In step S106, the control unit 6 causes the plurality of detection units 22 to detect the positions of the second number of marks provided in the pattern region 7a and the shot region 12, respectively. As described above, the imprint apparatus 1 according to the first embodiment includes the four detection units 22 to detect, at the same time, the positions of the marks respectively arranged at the four corners of the pattern region 7a and the four corners of the shot region 12. The control unit 6 causes the four detection units 22 to detect, at the same time, the positions of the marks arranged in the pattern region 7a and the shot region 12, respectively.

In step S107, the control unit 6 performs overlay between the pattern region 7a and the shot region 12 (overlay step) in the state in which the pattern region 7a and the shot region 12 have been deformed in the deformation step (step S105). The overlay step can be performed based on the detection result of the position by each detection unit 22 and the moving amount of each mark estimated in step S103. The overlay step can be performed based on, for example, the respective positions of the marks in the pattern region 7a and the marks in the shot region 12 obtained by correcting the detection result of the mark position by each detection unit 22 with the moving amount of each mark estimated in step S103. However, the overlay step is not limited to be performed based on the mark positions obtained by correcting the result of the detection by each detection unit 22. The overlay step may be performed based on, for example, the shape difference between the pattern region 7a and the shot region 12 obtained by correcting the target shape difference between the pattern region 7a and the shot region 12 with the moving amount of each mark.

In the overlay step, adjustment (for example, translation shift correction or rotation correction) of the relative positions of the pattern region 7a and the shot region 12, and deformation (for example, magnification correction or trapezoid correction) of at least one of the pattern region 7a and the shot region 12 are performed. In "adjustment", translation shift correction or rotation correction between the pattern region 7a and the shot region 12 is performed such that the shape of the region where deformation has been performed in the deformation step is maintained in a state in which the deformation has been performed. "Adjustment" can be performed by, for example, controlling the stage driving unit 20 of the substrate stage 4. In "deformation", magnification correction or trapezoid correction between the pattern region 7a and the shot region 12 is performed by deforming at least one of the pattern region 7a and the shot region 12.

Overlay between the pattern region 7a and the shot region 12 will now be described. FIGS. 4A and 4B are views for explaining overlay between the pattern region 7a and the shot region 12. As described above, when deforming the pattern region 7a and the shot region 12 in accordance with the driving amount determined in step S102, the position deviation may be caused between the marks at the four corners of the pattern region 7a and the marks at the four corners of the shot region 12. FIG. 4A is a view showing a state in which the position deviation is caused between the marks at the four corners of the pattern region 7a and the marks at the four corners of the shot region 12. In FIG. 4A, the solid line 30 indicates the shape of the shot region 12 and the broken line 31 indicates the shape of the pattern region 7a. At this time, assume that the overlay accuracy between the pattern region 7a and the shot region 12 is at a desired accuracy.

In this state, if each detection unit 22 is caused to detect only the positions of the marks provided at the four corners of the pattern region 7a and the four corners of the shot region 12, the control unit 6 can recognize the shape of the pattern region 7a as a linearity shape indicated by a chain double-dashed line 32 of FIG. 4A. Assume a case in which at least one region among the pattern region 7a and the shot region 12 is deformed such that the marks at the four corners of the pattern region 7a and the marks at the four corners of the shot region 12 match in the X and Y directions. In this case, as shown in FIG. 4B, the shape of the shot region 12 (solid line 30) and the shape of the pattern region 7a (chain double-dashed line 32) recognized based on the detection result overlap with each other. In practice, however, the shape of the pattern region 7a (broken line 31) and the shape of the shot region 12 (solid line 30) do not overlap with each other. As a result, the overlay accuracy between the pattern region 7a and the shot region 12 can be reduced. Therefore, in the overlay step, overlay between the pattern region 7a and the shot region 12 is performed such that the marks at the four corners of the pattern region 7a and the marks at the four corners of the shot region 12 are respectively arranged in the positions determined in consideration of the moving amounts estimated in step S103. The positions determined in consideration of the moving amounts are, as described above, the respective positions of the marks in the pattern region 7a and the marks in the shot region 12 obtained by correcting the detection results of the marks positions by the respective detection units 22 with the moving amounts estimated in step S103. This makes it possible to inhibit the overlay accuracy between the pattern region 7a and the shot region 12 in the state in which the pattern region 7a and the shot region 12 have been deformed in the deformation step from decreasing by performing the overlay step.

As described above, the imprint apparatus 1 according to the first embodiment performs overlay between the pattern region 7a and the shot region 12 based on the result of the detection by each detection unit 22 after the deformation step of deforming the pattern region 7a and the shot region 12 based on the shape information. Then, the imprint apparatus 1 performs overlay between the pattern region 7a and the shot region 12 in consideration of the moving amounts of the marks in the regions (the pattern region 7a and the shot region 12) where deformation has been performed in the deformation step. This allows the imprint apparatus 1 according to the first embodiment to accurately overlay the pattern region 7a on the mold and the shot region 12 on the substrate.

<Embodiment of Method of Manufacturing Article>

A method of manufacturing an article according to an embodiment of the present invention is suitable for manufacturing an article such as a microdevice (for example, a semiconductor device) or an element having a microstructure. The method of manufacturing an article according to the embodiment includes a step of forming a pattern on a resin applied to a substrate by using the imprint method (step of performing the imprint process on the substrate), and a step of processing the substrate on which the pattern has been formed (the substrate on which the imprint process has been performed) in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-189443 filed Sep. 17, 2014, which is hereby incorporated by reference herein in its entirety.

What is claimed is:

1. An imprint method of forming a pattern of an imprint material on a shot region of a substrate by a mold having a pattern region in which a pattern has been formed, each of the shot region and the pattern region including a mark, the method comprising:
    a deformation step of deforming at least one region among the pattern region and the shot region, based on information indicating a relative shape difference between the pattern region and the shot region measured in advance, such that the relative shape difference comes close to a target shape difference;
    an estimation step of estimating a positional deviation between the mark in the pattern region and the mark in the shot region, which is to be generated in a case of overlaying the pattern region and the shot region while deforming the at least one region by; and
    an alignment step of performing alignment between the pattern region and the shot region, based on the estimated positional deviation and detection results of a relative position between the mark in the pattern region and the mark in the shot region, such that the estimated positional deviation is formed in the relative position.

2. The method according to claim 1, wherein in the alignment step, the alignment between the pattern region and the shot region is performed based on a value obtained by correcting the detection result with the estimated positional deviation.

3. The method according to claim 1, wherein the alignment step includes adjusting relative positions of the pattern region and the shot region by translating the mold and the substrate.

4. The method according to claim 1, wherein the alignment step includes performing at least one of magnification correction and trapezoid correction between the pattern region and the shot region.

5. The method according to claim 1, wherein in the estimation step, the positional deviation is estimated for each mark to be used in the alignment step.

6. The method according to claim 1, wherein the information is obtained by using detection results of respective positions of marks having a first number among a plurality of marks which are provided in each of the pattern region and the shot region, and
    in the alignment step, the alignment is performed by using detection results of respective positions of marks having a second number among the plurality of marks provided in each of the pattern region and the shot region, the second number being smaller than the first number.

7. The method according to claim 6, wherein the marks which should be detected to obtain the information includes the marks which should be detected in the alignment step.

8. The method according to claim 6, wherein each of the pattern region and the shot region has a rectangular shape, and
    in the alignment step, the alignment is performed by using detection results of positions of marks respectively arranged at four corners of the pattern region and four corners of the shot region.

9. The method according to claim 1, further comprising a contacting step of bringing the mold and the imprint material into contact with each other,
    wherein in the alignment step, the alignment is performed in a state in which the mold and the imprint material are in contact with each other, after the contacting step.

10. The method according to claim 9, wherein in the deformation step, the at least one region is deformed in the state in which the mold and the imprint material are in contact with each other, after the contacting step.

11. The method according to claim 1, wherein in the deformation step, the at least one region is deformed such that overlay accuracy between the pattern region and the shot region falls within an allowable range by generating an error of shapes between the pattern region and the shot region.

12. The method according to claim 1, wherein a plurality of marks are provided in each of the pattern region and the shot region, and the number of marks selected for performing the alignment among the plurality of marks is smaller than the number of marks selected for obtaining the information.

13. The method according to claim 1, wherein the shape difference capable of correcting in the deformation step includes higher-order components than that capable of correcting in the alignment step.

14. An imprint apparatus that forms a pattern of an imprint material on a shot region of a substrate by a mold having a pattern region in which a pattern has been formed, each of the shot region and the pattern region including a mark, the apparatus comprising:
  a deformation unit configured to deform at least one region among the pattern region and the shot region; and
  a control unit configured to:
    cause the deformation unit to perform the at least one region, based on information indicating a relative shape difference between the pattern region and the shot region measured in advance, such that the relative shape difference comes close to a target shape difference;
    estimate a positional deviation between the mark in the pattern region and the mark in the shot region, which is to be generated in a case of overlaying the pattern region and the shot region while deforming the at least one region by deformation unit; and
    perform alignment between the pattern region and the shot region, based on the estimated positional deviation and detection results of a relative position between the mark in the pattern region and the mark in the shot region, such that the estimated positional deviation is formed in the relative position.

15. A method of manufacturing an article, the method comprising steps of:
  forming a pattern on a substrate using an imprint method; and
  processing the substrate, on which the pattern has been formed, to manufacture the article,
  wherein the imprint method is a method of forming a pattern of an imprint material on a shot region of the substrate by a mold having a pattern region in which the pattern has been formed, each of the shot region and the pattern region including a mark, and includes:
  a deformation step of deforming at least one region among the pattern region and the shot region, based on information indicating a relative shape difference between the shot region measured in advance, such that the relative shape difference comes close to a target shape difference;
  an estimation step of estimating a positional deviation between the mark in the pattern region and the mark in the shot region, which is to be generated in a case of overlaying the pattern region and the shot region while deforming the at least one region by the deformation step; and
  an alignment step of performing alignment between the pattern region and the shot region, based on the estimated positional deviation and detection results of a relative position between the mark in the pattern region and the mark in the shot region, such that the estimated positional deviation is formed in the relative position.

* * * * *